United States Patent

Nagatomo

[11] Patent Number: 5,541,428
[45] Date of Patent: Jul. 30, 1996

[54] SEMICONDUCTOR MEMORY DEVICE WITH SUPERIMPOSED STORAGE ELECTRODES

[75] Inventor: Yoshiki Nagatomo, Tokyo, Japan

[73] Assignee: Oki Electric Industry Co., Ltd., Tokyo, Japan

[21] Appl. No.: 355,156

[22] Filed: Dec. 8, 1994

[30] Foreign Application Priority Data

Dec. 8, 1993 [JP] Japan .................................. 5-308234

[51] Int. Cl.$^6$ ................................................ H01L 27/108
[52] U.S. Cl. ...................... 257/306; 257/307; 257/308; 257/309; 257/908
[58] Field of Search .................................. 257/206, 304, 257/305, 306, 309, 311, 905, 906, 908, 298, 307, 308; 365/154, 149

[56] References Cited

U.S. PATENT DOCUMENTS 5,103,275  4/1992  Miura et al. ........................ 257/306

OTHER PUBLICATIONS

Inoue et al., "A Spread Stacked Capacitor (SSC) Cell for 64 Mbit DRAMs," International Electron Device Meeting (IEDM), pp. 31–34, Dec. 3–6, 1989.

Primary Examiner—Minhloan Tran
Attorney, Agent, or Firm—Wenderoth, Lind & Ponack

[57] ABSTRACT

In a semiconductor memory device, storage electrodes of two memory cells adjacent to each other are superimposed with each other, with their contours being substantially aligned. As a result, the storage electrodes are extended to cover two memory cell regions. The superimposed storage electrodes are electrically insulated from each other, and the upper storage electrode extends through the lower storage electrode.

6 Claims, 14 Drawing Sheets

SEMICONDUCTOR MEMORY DEVICE WITH SUPERIMPOSED STORAGE ELECTRODES

BACKGROUND OF THE INVENTION

The present invention relates to the structure of memory cells of a semiconductor memory device, and in particular a dynamic-random access memory (DRAM).

An example of a configuration of and a method of making a DRAM in the prior art is shown, Inoue, et al, "A Spread Stacked Capacitor (SSC) Cell for 64 Mbit DRAMs", International Electron Device Meeting (IEDM), pp. 31–34, Dec. 3–6, 1989. According to this prior art technology, parts of storage electrodes adjacent to each other are superimposed with each other to enlarge the capacitor area. As a result, it is possible to obtain DRAMs having a memory cell capacitance larger than an ordinary stacked capacitor cell.

To facilitate understanding of the present invention, the configuration of the DRAM, and a method of making it, shown in the above-mentioned literature will next be described with reference to FIG. 8A to FIG. 8F. FIG. 8A to FIG. 8E are diagrams showing the steps of fabrication of a DRAM in the prior art. FIG. 8F is a plan view of FIG. 8E.

First, a device isolating oxide film 12 is formed on a silicon substrate 10. Next, a gate oxide film 14 is formed on the silicon substrate 10 between the device isolation oxide films 12. Next, word lines 16 and data lines (not shown) are formed. Next, a first oxide film 18, a nitride film 20 and a second oxide film 22 are formed in turn over the entire surface of the silicon substrate 10, with the gate oxide film 14 and the like having been formed. Next, a first contact hole 24 extending through the first oxide film 18, the nitride film 20 and the second oxide film 22 is formed. Next, a first storage electrode 26 is formed by photolithography and etching on the second oxide film 22, filling the first contact hole 24 (FIG. 8A).

Next, a third oxide film 28 is formed over the entire surface of the laminate body including the first storage electrode 26 having been formed. Next, a second contact hole 30 extending through the first to third oxide films 18, 22 and 28, and the nitride film 20 is formed (FIG. 8B). The second contact hole 30 is used as a contact hole for a storage electrode adjacent to the first storage electrode 26.

Then, a second storage electrode 32 is formed on the third oxide film 28, filling the second contact hole 30, by means of photolithography and etching (FIG. 8C).

Then, the second and third oxide films 22 and 28 above the nitride film 20 are removed (FIG. 8D).

Next, a capacitor dielectric film 34 is formed to cover the surface of the first and second storage electrodes 26 and 32. Next, a cell plate 36 is formed on the capacitor dielectric film 34, so that the cell plate 36 is opposite to the first and second storage electrodes 26 and 32, through the capacitor dielectric film 34 (FIG. BE). The plan view of FIG. 8E is shown in FIG. 8F. FIG. 8E shows a section along line A—A in FIG. 8F.

In the conventional DRAM, parts of the first and second storage electrodes adjacent in the data line direction are superimposed with or overlap each other, and increase of the capacitance by the amount of overlap is intended.

The operation of the conventional semiconductor memory device will next be described. In each memory cell, the word line extends over the gate oxide film between the data line contact hole and the storage electrode contact hole, and the word line over the gate oxide film serves as the gate electrode for the switching device. The signal from the data line is given as an electric charge to the storage electrode via the storage electrode contact hole when the gate electrode is in the ON state. The storage electrode and the cell plate confronting the storage electrode via the capacitor dielectric film form a capacitive part. Normally, a constant voltage is applied to the cell plate, so that potential (electric charge) can be held as a bit signal in the capacitive part.

In the memory configuration obtained in the prior art example, the storage electrodes overlap only in the region up to the contact hole of the memory cells adjacent to each other. As a result, the prior art memory configuration is associated with a limitation to the increase in the area of the capacitor, and this imposes a limitation to further increase in the degree of integration. That is, it is difficult to maintain or enlarge the area of the storage electrode while reducing the area required for each memory cell.

In the steps of fabrication in the above described prior art example, the outer contour of the storage electrodes is defined, for each storage electrode, by photography and etching. As a result, the fabrication is complicated.

SUMMARY OF THE INVENTION

A first object of the invention is to provide a semiconductor memory device with which it is possible to enlarge the area of the storage capacitor of the memory cell.

A second object of the invention is to provide a method of fabricating the semiconductor memory device with which it is easy to obtain a capacitive part with enlarged storage electrode area.

To achieve the first object of the invention, in a semiconductor memory device according to the invention having memory cells provided on an underlying layer, a plurality of storage electrodes are provided for the respective memory cells and in opposition to a cell plate through a capacitor dielectric film, the plurality of storage electrodes adjacent to each other are superimposed with each other, with the entire contours thereof defined by their outer edges being substantially aligned, and the superimposed storage electrodes are electrically insulated from each other, and each of the superimposed electrodes is electrically connected to the underlying layer through another electrode or electrodes which lie below said each of the superimposed electrodes.

To achieve the second object of the invention, a method of making a semiconductor memory device, in particular of making capacitive parts of memory cells of the semiconductor memory device, according to the invention comprises the steps of:

(a) forming an etching stopper layer over an underlying layer in which device isolating regions have been formed;

(b) forming a first sacrifice film over the etching stopper layer;

(c) forming a first contact hole penetrating from the surface of the sacrifice film down to said underlying layer;

(d) forming a first storage electrode film of a lowermost layer over said first sacrifice film, filling said first contact hole;

(e) forming a second sacrifice film over said first storage electrode film of the lowermost layer;

(f) forming a second contact hole penetrating from the surface of said second sacrifice film through the first storage electrode film down to said underlying layer;

(g) forming an insulating film on an exposed part of the second storage electrode film on a side surface of said second contact hole;

(h) forming a second storage electrode film on the second contact hole and the second sacrifice film, after the formation of the insulating film;

(i) performing photolithography and etching, on the thus laminated layers with said storage electrode having been formed, to define or form storage electrodes having their contours substantially aligned;

(j) removing all the sacrifice films after the storage electrodes are defined or formed; and (k) covering the surface of the storage electrode with a capacitor dielectric film; and (l) then forming a cell plate in opposition to said storage electrode through the capacitor dielectric film.

The above-mentioned steps (e) to (h) may be repeated at least once.

The above-mentioned step (g) may preferably comprise the step of forming a thermal oxide film, as said insulating film, on the surface of said exposed part of the storage electrode film on the side surface of said second contact hole.

The above-mentioned step (g) may preferably comprise the step of forming a sidewall on the side surface of said second contact hole.

According to the configuration of the semiconductor memory device of the invention, the storage electrodes of a plurality of memory cells adjacent to each other are provided with their contours substantially aligned with each other. Moreover, the storage electrodes except the storage electrode in the lowest layer are electrically connected to the underlying layer (e.g., the semiconductor substrate) via a contact hole extending through the storage electrode or electrodes below it, and the storage electrodes superimposed over each other are electrically insulated from each other. As a result, the storage electrodes can be extended beyond the contact hole of the adjacent storage electrode. The area of the storage electrode can be enlarged and the capacitance of the capacitor can be increased without increase of the area occupied by each memory cell.

According to the configuration of the semiconductor memory device of the invention, when three or more layers of the storage electrodes are superimposed, a substantial increase in the area of the storage electrodes, compared with the prior art, can be attained.

According to the method of fabricating the semiconductor memory device of the invention, the storage electrodes are formed, being superimposed, and then the first photolithography and etching are conducted to define the contour of the storage electrodes. As a result, the fabrication is simplified, compared with the method in which storage electrodes are defined each time each layer of the storage electrode is formed. According to the method of fabricating the semiconductor memory device of the invention, the contact holes are formed, and then, the insulating films (thermal oxide films or sidewalls) are formed on the side surfaces of the contact holes, so that it is possible to electrically insulate the storage electrodes which are superimposed with respect to each other.

DETAILED DESCRIPTION OF THE PREFERRED EMBODIMENTS

A semiconductor memory device according to the present invention and a method of fabricating it will next be described with reference to the drawings. The drawings schematically show the size, the shape and the position of each component. The scope of the invention is not limited to the illustrated embodiments.

Embodiment 1

Figure 1A:
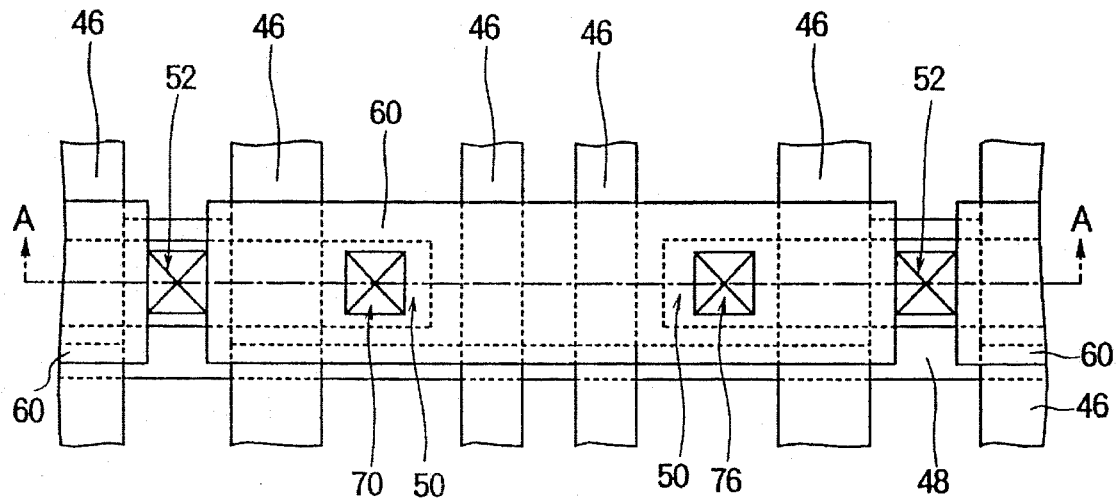
FIG. 1A and FIG. 1B are a plan view and a sectional view showing the configuration of the semiconductor memory device of Embodiment 1.
Figure 1B:
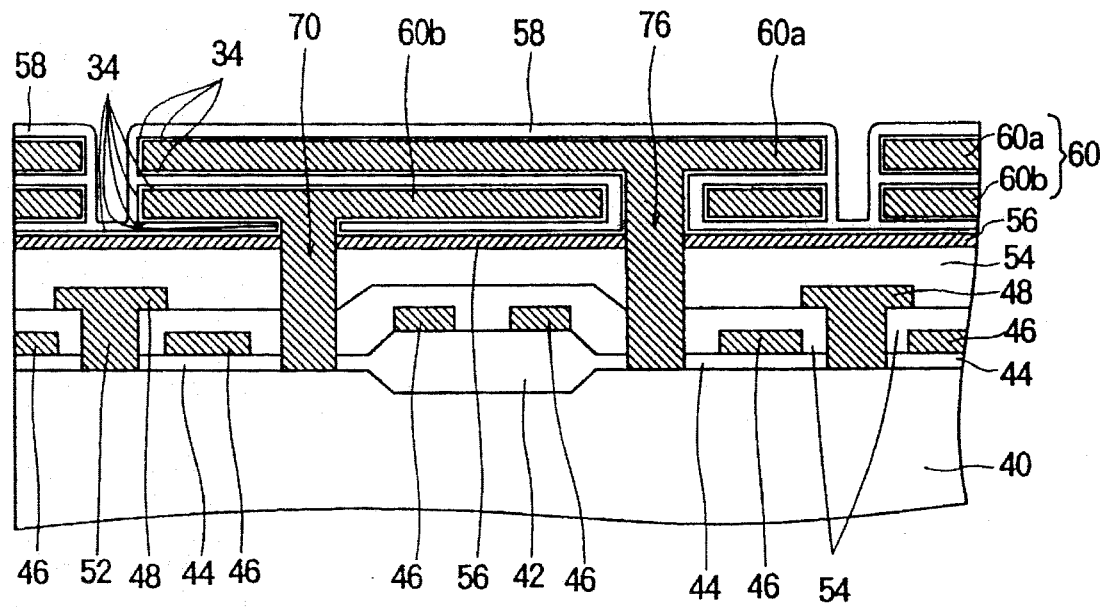

A semiconductor memory device of a first embodiment, Embodiment 1, of this invention will be described with reference to FIG. 1A and FIG. 1B. FIG. 1A is a plan view showing the semiconductor memory device of Embodiment 1. FIG. 1B is a sectional view along line A—A in FIG. 1A. In FIG. 1A, the cell plate, the etching stopper layer and the interlayer insulating layer are omitted.

In this embodiment, a silicon substrate 40 is used as the underlying layer, and arranged over the silicon substrate 40 are memory cells isolated by field oxide films 42. Word lines 46 and data lines 48 extending in directions orthogonal to each other are provided in planar patterns over a gate oxide films 44 provided in the memory cell regions and the field oxide films 42. The data lines 48 are electrically connected to the silicon substrate 40 at data line contact holes 52 provided in memory cell regions 50. An interlayer insulating film 54 and an etching stopper layer 56 in the form of a nitride film are provided in turn over the silicon substrate 40.

Referring to FIG. 1A and FIG. 1B, memory cells for two bits arranged in the direction of the data line are shown. Each of the memory cells is provided with a capacitive part having, above the etching stopper layer 56, storage electrodes 60a and 60b opposite to cell plate 58 through capacitor dielectric film 34 formed between the cell plate 58 and the storage electrodes 60a and 60b.

In this embodiment, the storage electrodes of the two memory cells adjacent to each other in the direction of the data line are superimposed, with their contours being substantially aligned. As a result, the storage electrodes 60a and 60b can be extended to cover the regions of two memory cells.

The storage electrodes 60a and 60b superimposed with each other are electrically insulated from each other, and, as shown in FIG. 1B, each of the storage electrodes, 60a, is electrically connected to silicon substrate 40 through any other storage electrode 60b which may be beneath and superimposed with the storage electrode 60a in question. In the illustrated example, the upper storage electrode 60a extends through the lower storage electrode 60b.

Figure 2A:
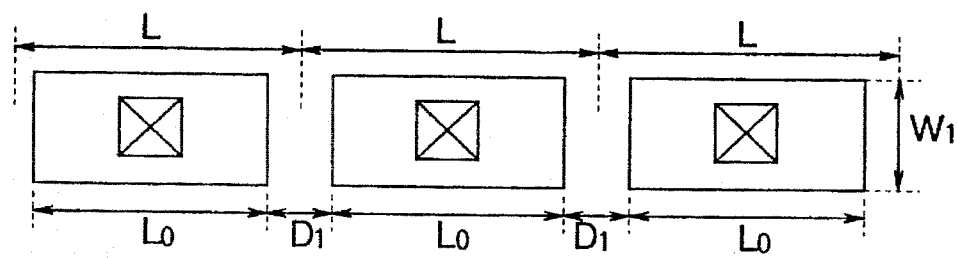
FIG. 2A to FIG. 2C are plan views showing planar patterns, and are used for comparing and explaining the area of the storage electrode of the configuration similar to that of the semiconductor memory device of Embodiment 1, and the area of the storage electrode of the configuration similar to that of the prior art example.
Figure 2B:
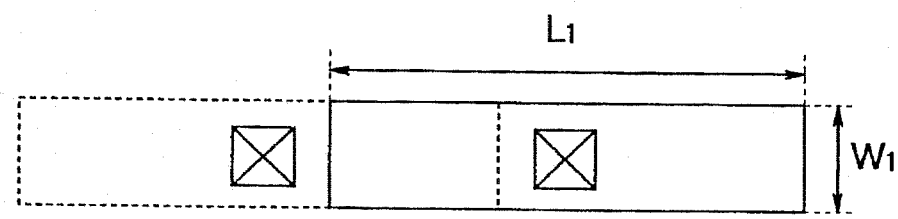
Figure 2C:
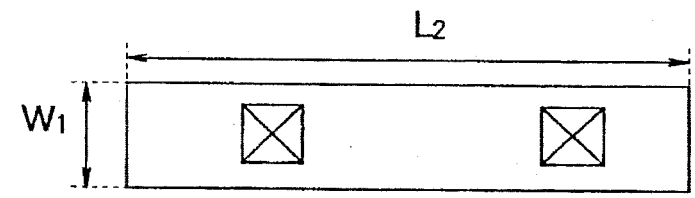

FIG. 2A to FIG. 2C will next be used to explain the area of the storage electrodes of the configuration similar to the semiconductor memory device of this embodiment, in comparison with the area of the storage electrodes of the configuration similar to the prior art example. FIG. 2A shows a basic pattern of the storage electrodes of a 256 Mbit DRAM. FIG. 2B shows a similar planar pattern of the storage electrodes of the prior art example. FIG. 2C shows a similar planar pattern of the storage electrode of Embodiment 1. It is assumed that the area per memory cell is equal in FIG. 2A to FIG. 2C. In the following calculation of the areas of the storage electrodes, the areas of the contact holes and of the parts surrounding the contact holes for insulating the storage electrodes from each other will be disregarded.

First, in the memory cell of the basic pattern shown in FIG. 2A, the storage electrodes are provided energy L=1.2 μm, with a spacing D1=0.2 μm between adjacent storage electrodes. If it is estimated that the width W1 of the storage electrode is 0.4 μm, and the length L0 of the storage electrode is 1.0 μm, then the area S0 of the storage electrode is given by:

$$S0 = W1 \times L0 = 0.4 \times 1.0 \ \mu m^2$$

Next, in the case of the planar pattern of FIG. 2B, similar to the prior art example, in which the storage electrodes partially overlap, it is estimated that the length L1 of the storage electrode storage is 1.8 μm, then $$S1 = W1 \times L1 = 0.4 \times 1.8 \ \mu m^2$$

The capacitance of the capacitive part C1 is given by:

$$C1 = (\epsilon \epsilon_0 / d1) \times S1 \times 2$$
$$= 16.5 \times 10^{-15} F = 16.5 fF$$

Here, $\epsilon$ represents the dielectric constant of the capacitor dielectric film, and is 3.9, $\epsilon_0$ represents the dielectric constant of vacuum and is $8.85 \times 10^{-14}$ and $d1$ represents the thickness of the capacitor dielectric film and is $30 \times 10^{-8}$ m. Because the upper and lower surfaces of the storage electrode are opposite to the cell plate, S1 is multiplied by 2.

In the case of the planar pattern shown in FIG. 2C, in which the adjacent storage electrodes are superimposed with their contours being aligned, the length L2 of the storage electrode is estimated to be 2.2 μm, then the area S2 of the storage electrode is given by:

$$S2 = W1 \times L2 = 0.4 \times 2.2 \ \mu m^2$$

The capacitance C2 of the capacitive part of the memory cell is given by:

$$C2 = (\epsilon \epsilon_0 / d1) \times S2 \times 2$$
$$= 20.3 \times 10^{-15} F = 20.3 fF$$

Here, $\epsilon$, $\epsilon_0$ and d1 are values identical to those used for calculation of C1.

As will be seen, with the semiconductor memory device of the invention, it is possible to enlarge the area of the storage electrode to increase the capacitance of the capacitor. Moreover, if the storage electrodes of three or more memory cells adjacent to each other are superimposed, to form a three-layer structure or a structure of more layers, the area of the storage electrode can be further increased.

Embodiment 2

Figure 3A:
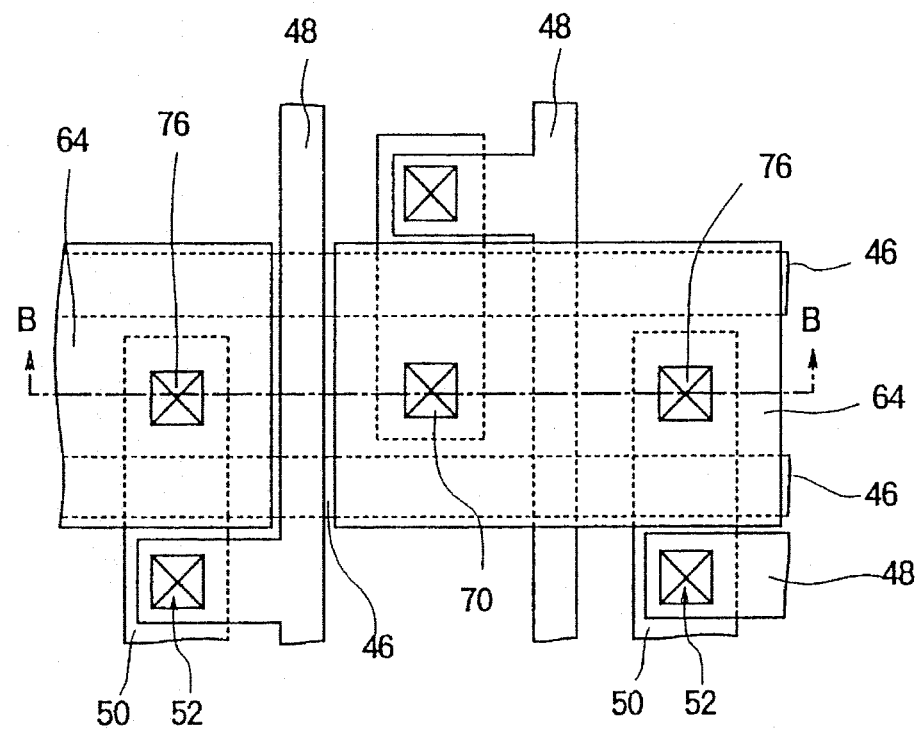
FIG. 3A and FIG. 3B are a plan view and a sectional view showing the configuration of the semiconductor memory device of Embodiment 2.
Figure 3B:
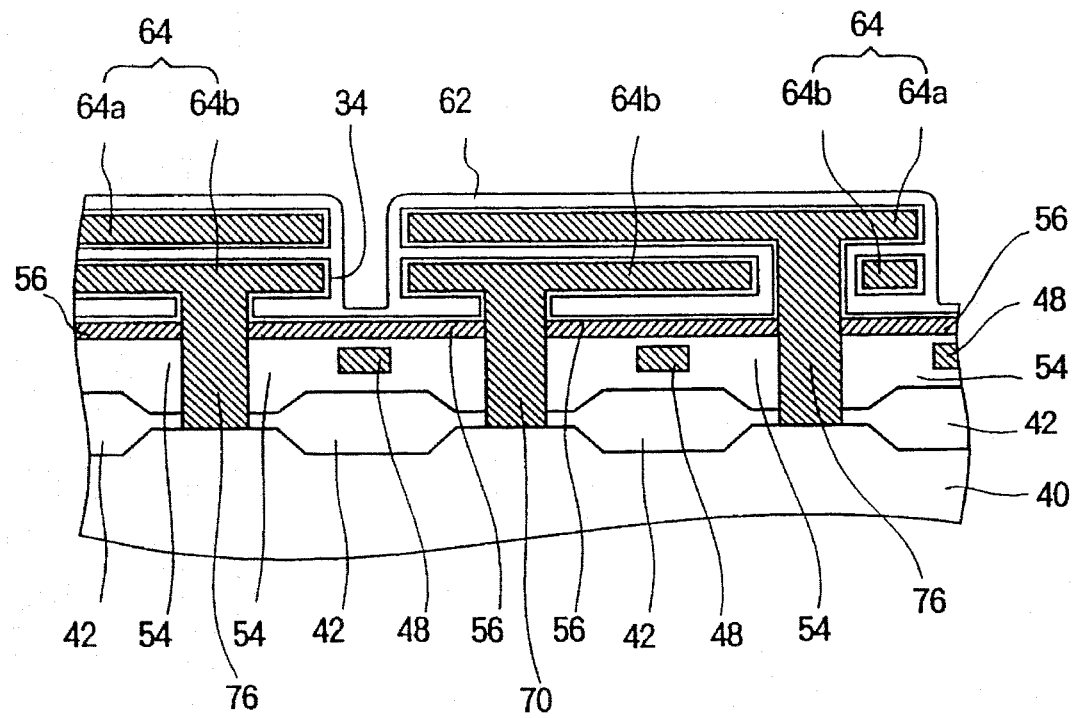

Next, a semiconductor memory device of another embodiment, Embodiment 2, will be described. FIG. 3A is a plan view for explaining the semiconductor memory device of Embodiment 2. FIG. 3B is sectional view along line B—B in FIG. 3A. In FIG. 3A, the cell plate, the etching stopper layer and the interlayer insulating layer are omitted.

In this embodiment, like Embodiment 1, a silicon substrate 40 is used as the underlying layer, and arranged on this silicon substrate 40 are memory cells isolated by field oxide films 42. Word lines 46 and data lines 48 extending in directions orthogonal to each other are provided over the silicon substrate 40. The data lines 48 are connected to the silicon substrate 40 at the data line contact holes 52 in the memory cell regions 50. An interlayer insulating film 54 and etching stopper layer 56 in the form of a nitride film are provided in turn over the silicon substrate 40.

In FIG. 3A and FIG. 3B, memory cells for two bits arranged in the direction of the word line are illustrated. Each of the memory cells are provided with a capacitive part having a storage electrode 64 opposite to a cell plate 62 through a capacitor dielectric film 34 formed between the cell plate 62 and the storage electrodes 64a and 64b. In this embodiment, the storage electrodes 64a and 64b of two memory cells adjacent to each other in the direction of the word line are superimposed, with their contours being aligned with each other. As a result, the storage capacitors 64a and 64b can be extended to cover two memory cells. Moreover, as shown in FIG. 3B, the upper storage electrode 64a extends through the lower storage electrode 64b.

When the storage electrodes are extended to cover two memory cells adjacent to each other, it is possible to provide the storage electrode to cover the parts which are in the spacings between the adjacent memory cells. The area of the spacings is proportional to the length of the sides adjacent to each other, if the distance between the adjacent memory cells is fixed. If the basic pattern is rectangular (with one side being longer than the other), the area of the storage electrode can be enlarged to a larger degree if the storage electrode is extended to cover the memory cell adjacent to a longer side, than if it is extended to cover the memory cell adjacent to a shorter side.

Accordingly, if the basic pattern is elongated in the direction of the data line, the area of the storage electrode is enlarged to a larger degree if the storage electrode is extended in the direction of the word line than if it is extended in the direction of the data line. For instance, the storage electrode of Embodiment 2 can be about 10% larger than that of Embodiment 1.

Embodiment 3

A method of fabricating the semiconductor memory device of another embodiment, Embodiment 3, of the invention will be described with reference to FIG. 4A to FIG. 4K. FIG. 4A to FIG. 4K show the semiconductor memory device at various steps of fabrication. This method can be used to produce the semiconductor memory device of Embodiment 1 or Embodiment 2.

To fabricate a capacitive part of a memory cell of a semiconductor memory device, first, an etching stopper layer 56 is formed over an underlying layer 40 with device isolating regions 42 having been formed. In this embodiment, before forming the etching stopper layer 56, a field oxide film 42 as a device isolating region and a gate oxide film 66 of a thickness of 30 to 200 angstrom are formed over a silicon substrate 40 as the underlying layer. Next, a polysilicon film (not shown) of a thickness of 500 to 3000 angstrom is formed over the field oxide film 42 and the gate oxide film 66. Next, word lines 46 are formed by conducting ordinary photolithography and etching on the polysilicon film. Next, a CVD oxide film 54a of a thickness of 1000 to 8000 angstrom is formed, as a first interlayer insulating layer, over the entire silicon substrate 40 with the word lines 46 having been formed.

Figure 4A:
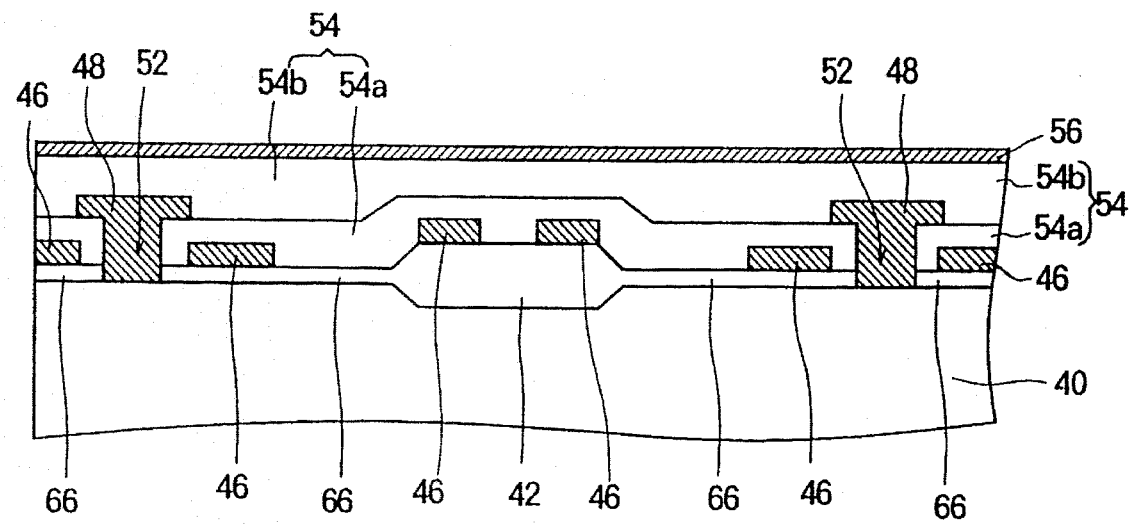
FIG. 4A to FIG. 4K are sectional diagrams showing the semiconductor memory device of Embodiment 3 at various steps during the method of fabrication.

Next, data line contact holes 52 extending from the surface of the CVD oxide film 54a through the gate oxide 66 to the silicon substrate 40 are formed. Next, a polysilicon film (not shown) is grown to a thickness of 300 to 2000 angstrom over the data line contact holes and the CVD oxide film 54a. Next, photolithography and etching are conducted on the polysilicon film to form data lines 48. The data lines 48 intersect orthogonally, as seen in plan view, with the word lines 46. A CVD oxide film 54b of a thickness of 1000 to 8000 angstrom is formed, as a second interlayer insulating layer, on the entire surface over the data lines 48 and the first interlayer insulating layer 54a. Next, a nitride film of a thickness of 50 to 1000 angstrom is formed, as etching stopper layer 56, over the entire surface of the second interlayer insulating layer 54b (FIG. 4A).

Figure 4B:
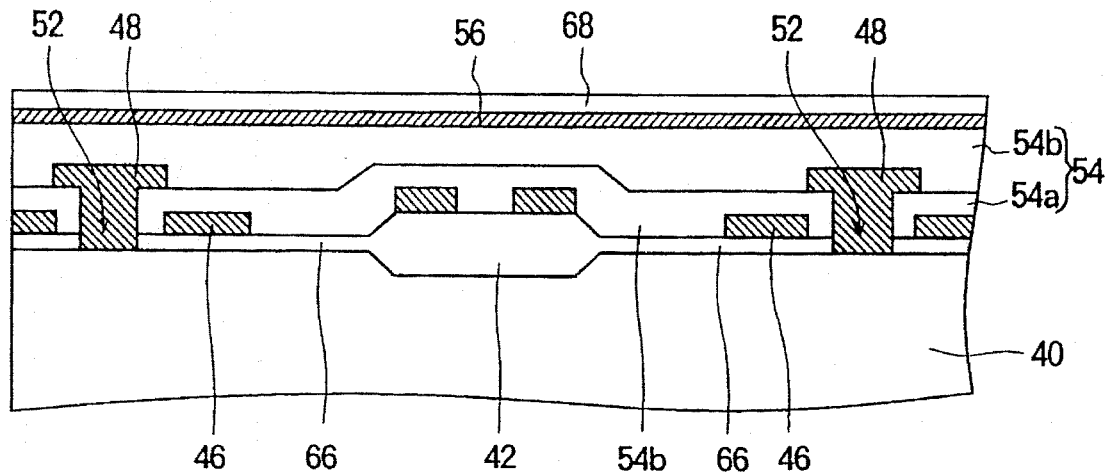

Next, a CVD oxide film of a thickness of 500 to 3000 angstrom is formed as a first sacrifice film 68 over, e.g., directly on the etching stopper layer 56 (FIG. 4B).

Figure 4C:
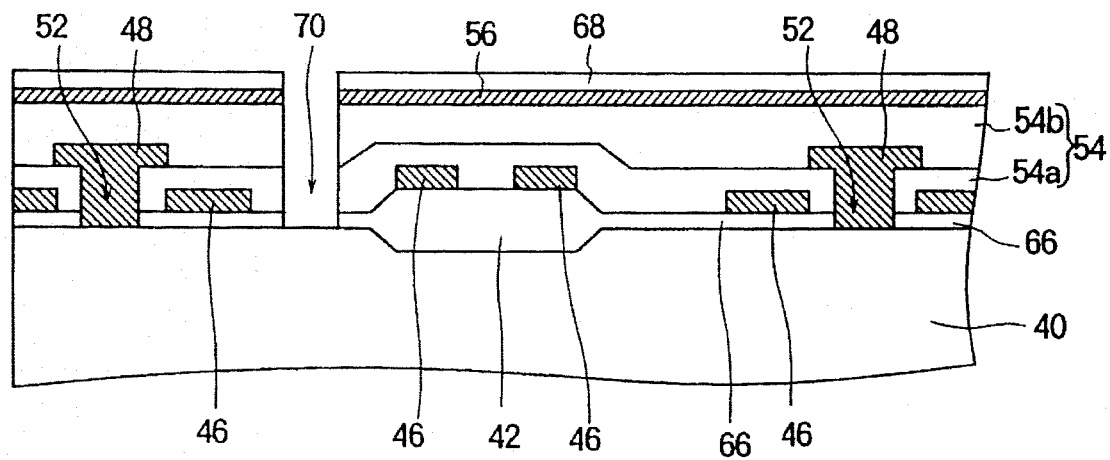

Next, photolithography and etching technique is used to form a first contact hole 70 extending from the surface of the sacrifice film 68 to the silicon substrate 40 (FIG. 4C).

Figure 4D:
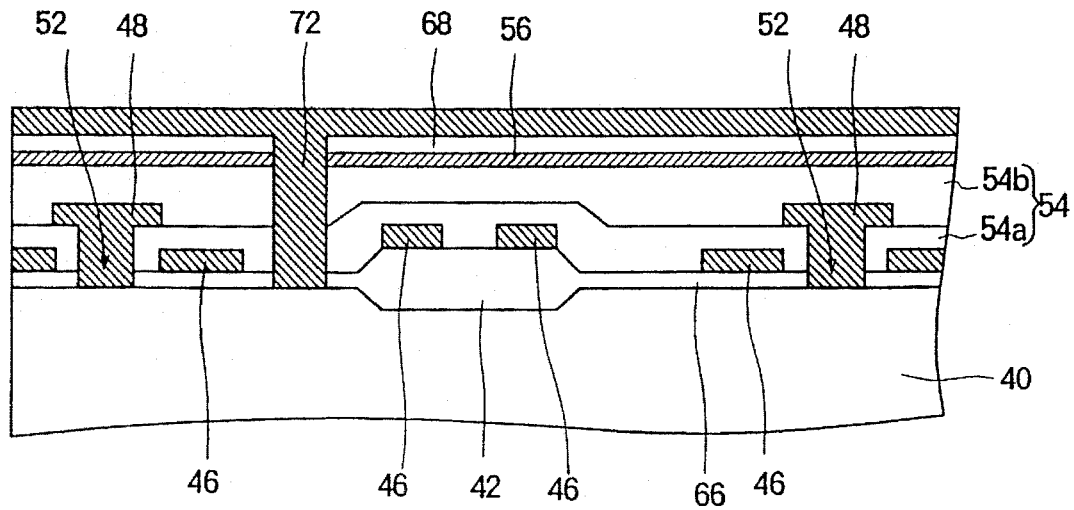

Next, a polysilicon film (not shown) of a thickness of 300 to 3000 angstrom is formed using the CVD method on the sacrifice film 68, filling the first contact hole 70, and impurities are introduced to a density of $10^{20}$ to $10^{21}$/cm$^3$ in the polysilicon film by means of thermal diffusion or ion implantation, to form lower storage electrode film 72. This storage electrode film will be called a first storage electrode film 72 (FIG. 4D).

Figure 4E:
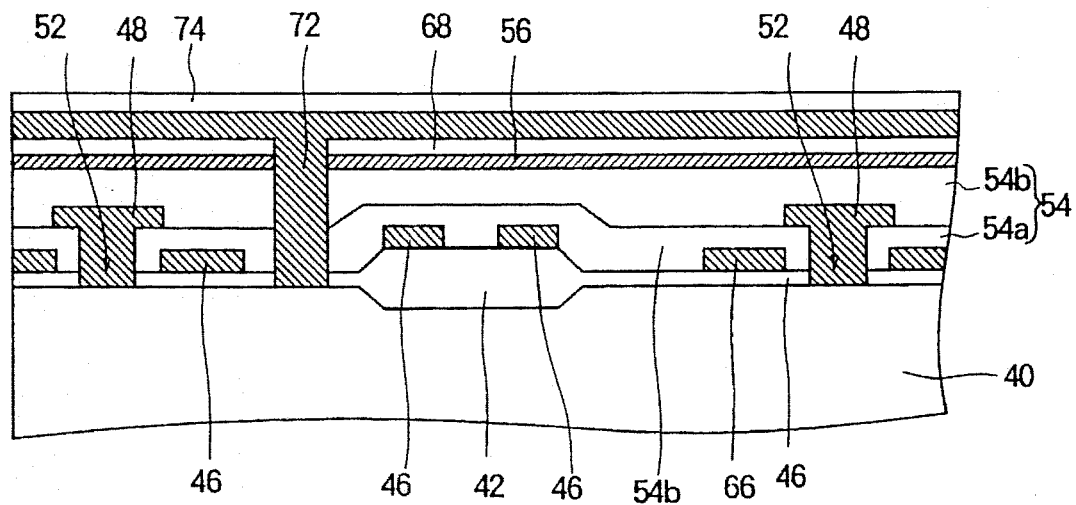

Next, a CVD oxide film 74 of a thickness of 500 to 2000 angstrom is formed as a new, or second sacrifice film over, e.g., directly on, the first storage electrode film 72 (FIG. 4E).

Figure 4F:
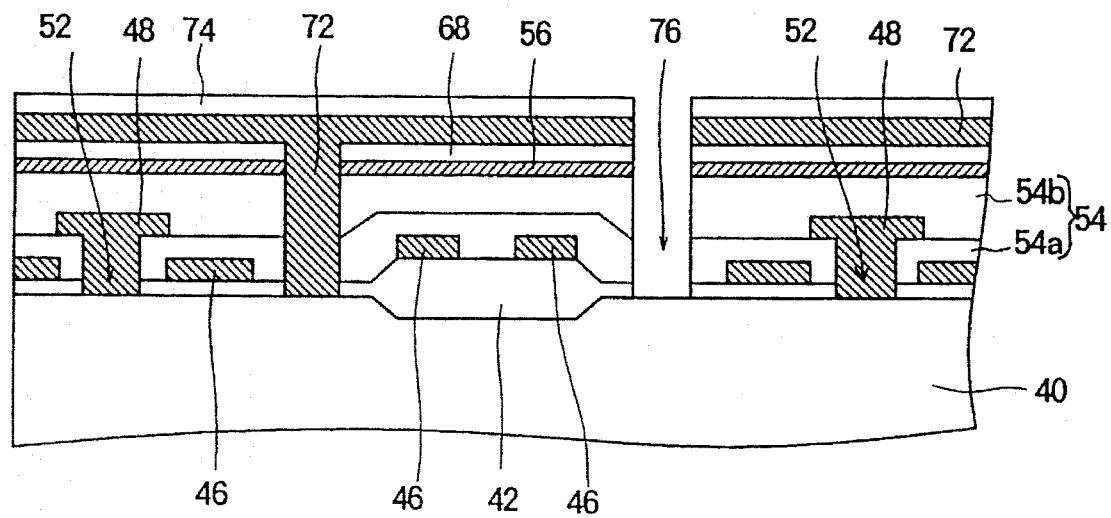

Next, a second contact hole 76 extending from the surface of the new sacrifice film 74, through the first storage electrode film 72 to the silicon substrate 40 is formed (FIG. 4F).

Figure 4G:
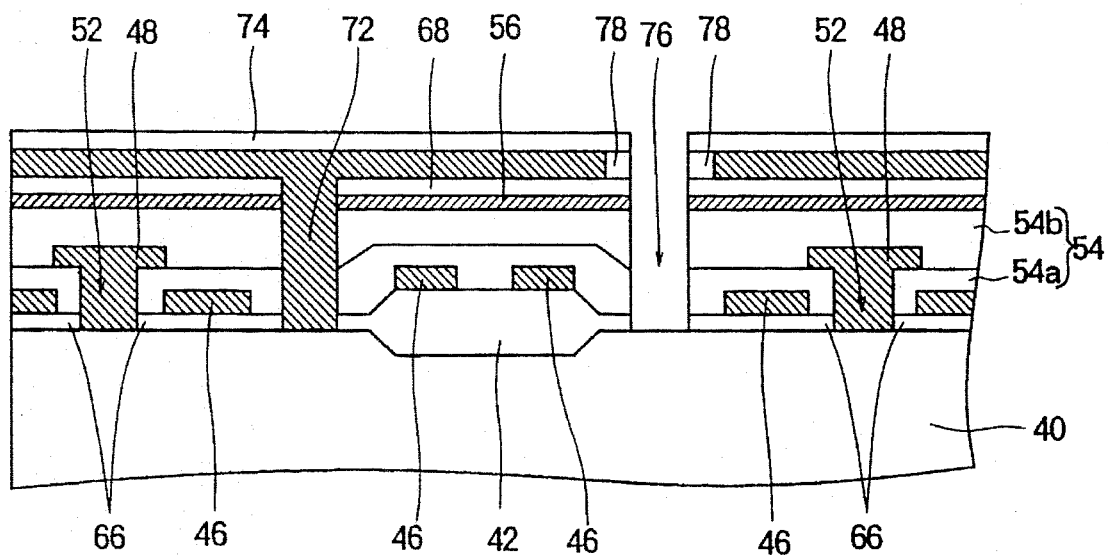

Next, an insulating film 78 is formed on the part of the first storage electrode film 72 exposed on the side surface of the second contact hole 76. In Embodiment 3, a thermal oxide film 78 is formed as this insulating film. For this purpose, first, thermal oxide film is formed, by the thermal oxidation method on the surface of the part of the first storage electrode film 72 exposed on the side surface of the second contact hole 76. As for the specific conditions of the thermal oxidation, if oxidation is performed at a temperature of 850° C. in the wet atmosphere, it is possible to form an oxide film down to 200 to 1000 angstrom from the surface. By this oxidation, a thermal oxide film is also formed at the bottom of the second contact hole 76. Therefore, anisotropic dry etching is used to remove the thermal oxide film formed at the bottom of the second contact hole 76, to thereby expose the silicon substrate 40 (FIG. 4G).

Figure 4H:
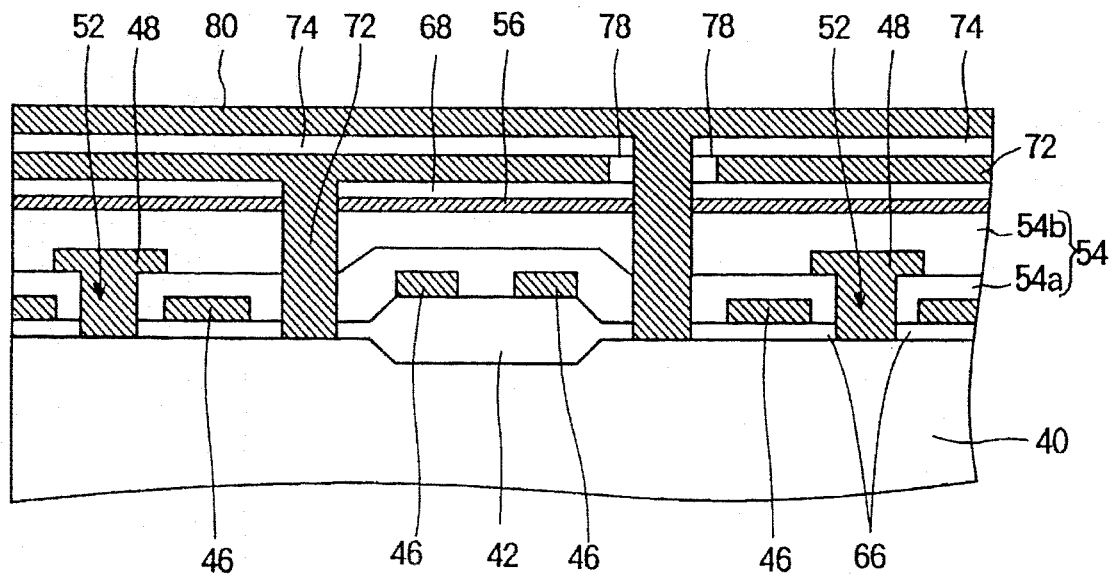

Next, after the thermal oxide film 78 is formed, a polysilicon film is formed as an upper storage electrode film 80 by the LPCVD method over the new sacrifice film 74, filling the second contact hole, and, like the first storage electrode film 72, impurities are introduced. The upper storage electrode film 80 will be referred to as a second storage electrode film 80 (FIG. 4H).

Figure 4I:
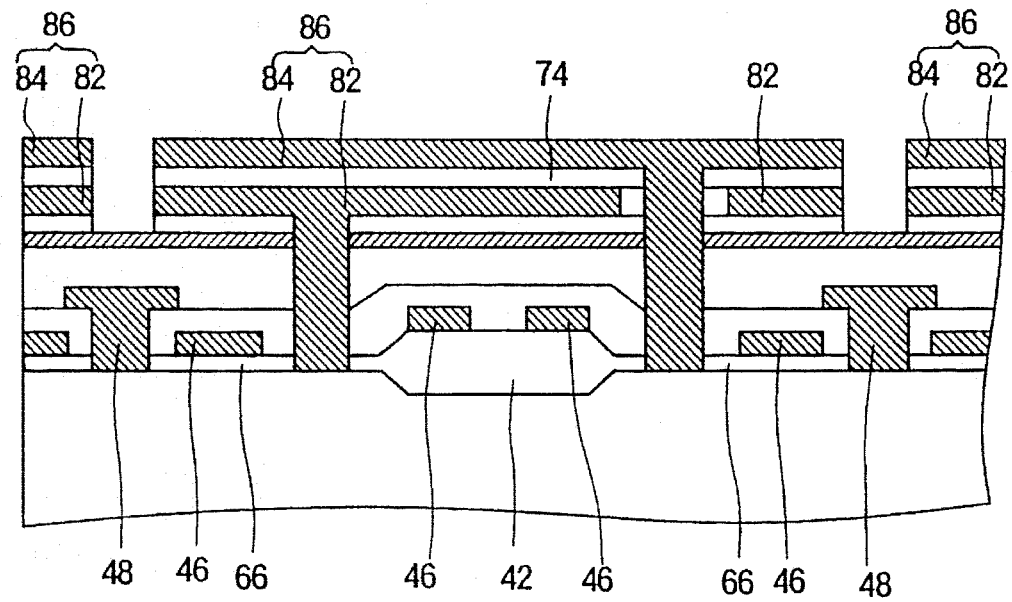

Photolithography and etching are conducted on the laminate body with the second storage electrode film 80 having been defined or formed, to define storage electrodes superimposed, with their contours being aligned. The photolithography and etching need be conducted just once for defining both the two storage electrodes because their contours (after the photolithography and etching) should be aligned. In this example, a first storage electrode 82 is defined or formed from the first storage electrode film 72, and a second storage electrode 84 is defined or formed from the second storage electrode film 80. The first and second storage electrodes may be collectively referred to as storage electrode 86 (FIG. 4I).

Figure 4J:
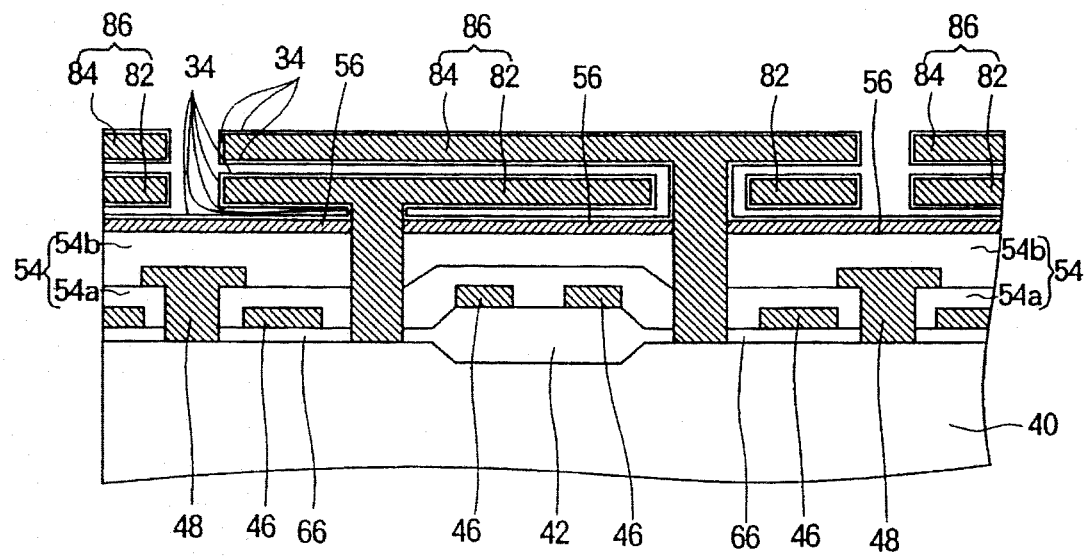

After the first and second electrodes 82 and 84 are formed, all the sacrifice films 68 and 74 are removed using hydrofluoric acid, for example. The thermal oxide film 78 in the second contact hole 76 is also removed (FIG. 4J).

Figure 4K:
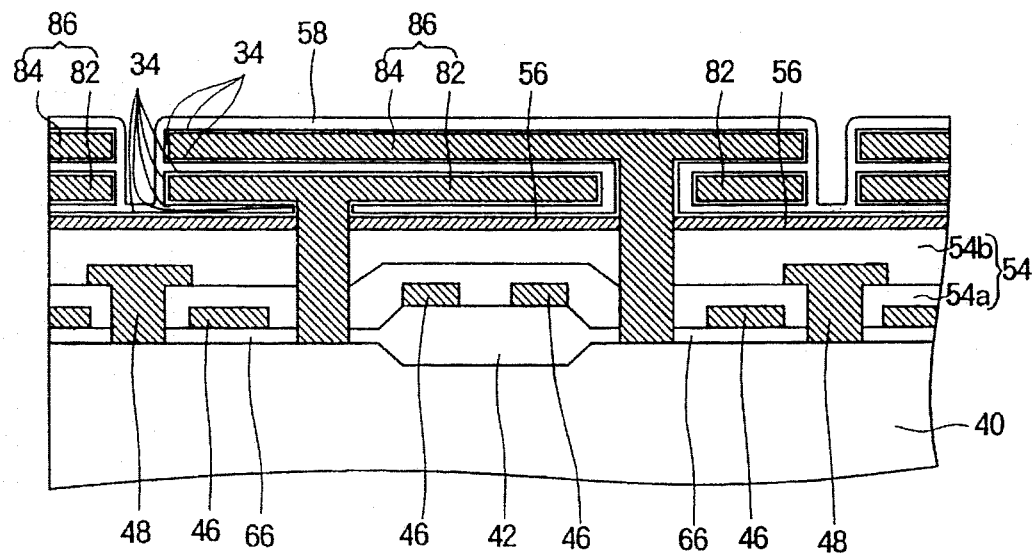

Next, a capacitor dielectric film 34 is formed to cover the surfaces of the storage electrode 86. In this example, a nitride film is grown as the capacitor dielectric film 34 to a thickness of 20 to 100 angstrom by means of the LPCVD method. Next, a cell plate 58 is formed on the capacitor dielectric film 34. The cell plate 58 is opposite to the storage electrode 86 through the capacitor dielectric film 34. The cell plate 58 may preferably be formed by growing a polysilicon film to a thickness of 300 to 2000 angstrom by means of LPCVD and introducing impurities in the polysilicon film (FIG. 4K).

Embodiment 4

Figure 5A:
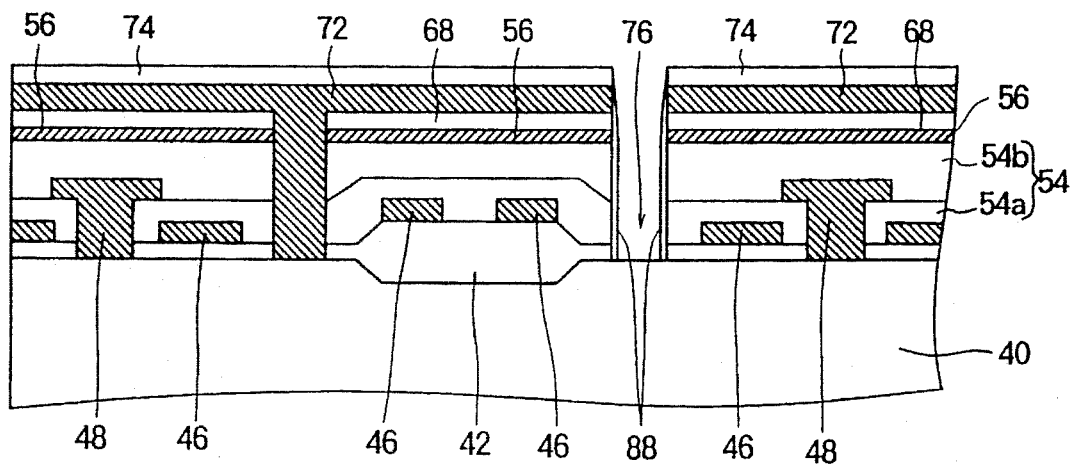
FIG. 5A to FIG. 5C are sectional diagrams showing the semiconductor memory device of Embodiment 4 at various steps during the method of fabrication.
Figure 5B:
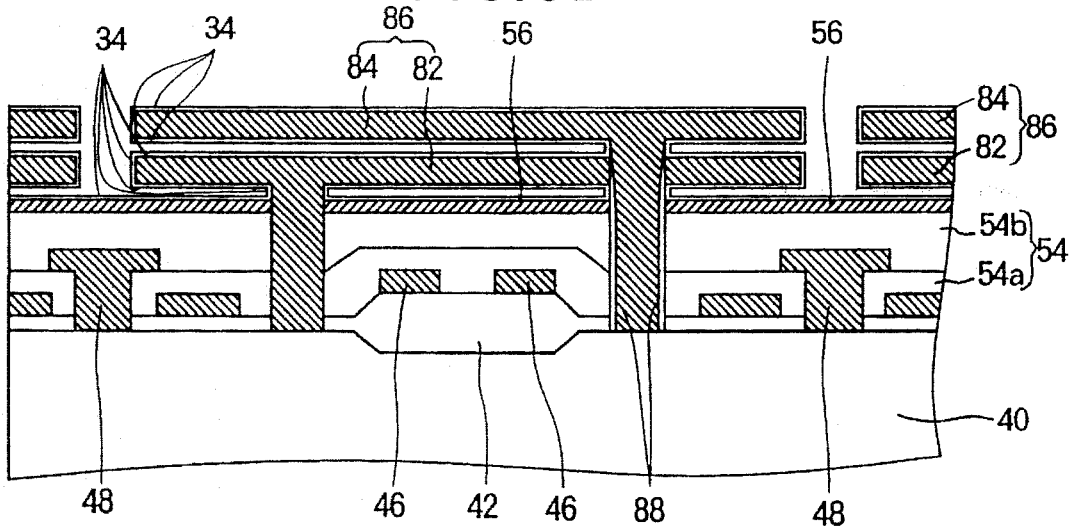
Figure 5C:
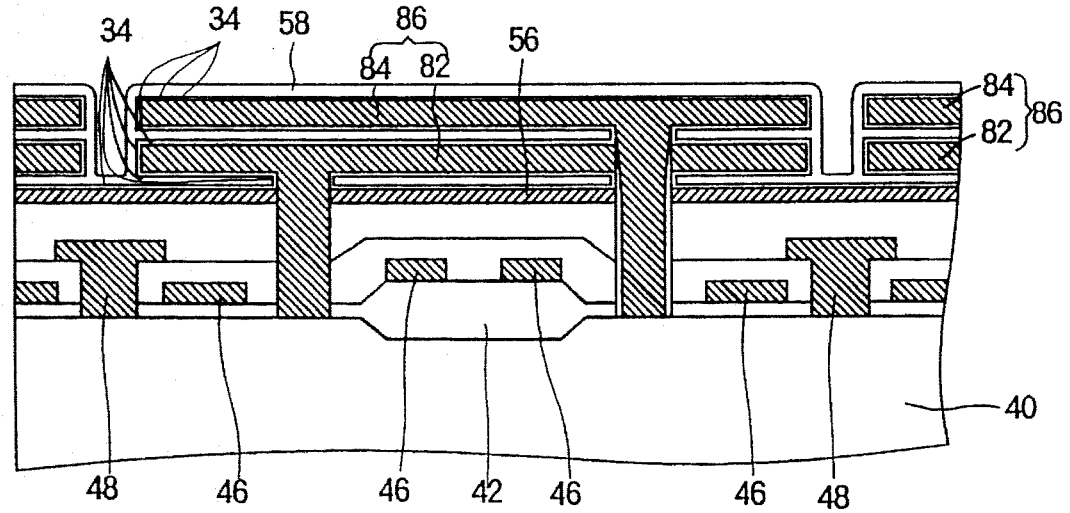

A method of fabricating the semiconductor memory device of another embodiment, Embodiment 4, will be described with reference to FIG. 5A to FIG. 5C. FIG. 5A to FIG. 5C show steps subsequent to the step shown in FIG. 4F. The method of this embodiment can also be used to fabricate the semiconductor memory device of Embodiment 1 or Embodiment 2.

In Embodiment 4, a sidewall 88 is formed on the side surface of the second contact hole 76 formed in Embodiment 3. In Embodiment 4, the steps up to the formation of the second contact hole 76 are identical to those of Embodiment 3, so their description will be omitted.

After the formation of the second contact hole 76 shown in FIG. 4F, a nitride film (not shown) covering the side surface and the bottom surface of the second contact hole 76 is grown to a thickness of 100 to 1000 angstrom by means of LPCVD. Next, anisotropic etching is conducted on the nitride film to form sidewall 88 on the side surface of the second contact hole 76. By this anisotropic etching, the nitride film formed on the bottom surface of the second contact hole 76 is removed and part of the silicon substrate 40 is exposed (FIG. 5A).

Next, as in Embodiment 3, a second storage electrode film (not shown) is formed over the new sacrifice film 74, filling the second contact hole 76. Next, photolithography and etching are conducted just once on the laminate body with the second electrode film having been formed to define the first and second storage electrodes 82 and 84 superimposed, with their contours being aligned. After the first and second storage electrodes 82 and 84 are defined, all the sacrifice films 68 and 74 are removed. The sidewall 88 is not removed (FIG. 5B).

Next, as in Embodiment 3, a capacitor dielectric film 34 is formed to cover the surfaces of the first and second storage electrodes, and then a cell plate 58 is formed on the capacitor dielectric film 34, so that cell plate 58 is opposite to the storage electrodes through the capacitor dielectric film 34 (FIG. 5C).

Embodiment 5

Figure 6:
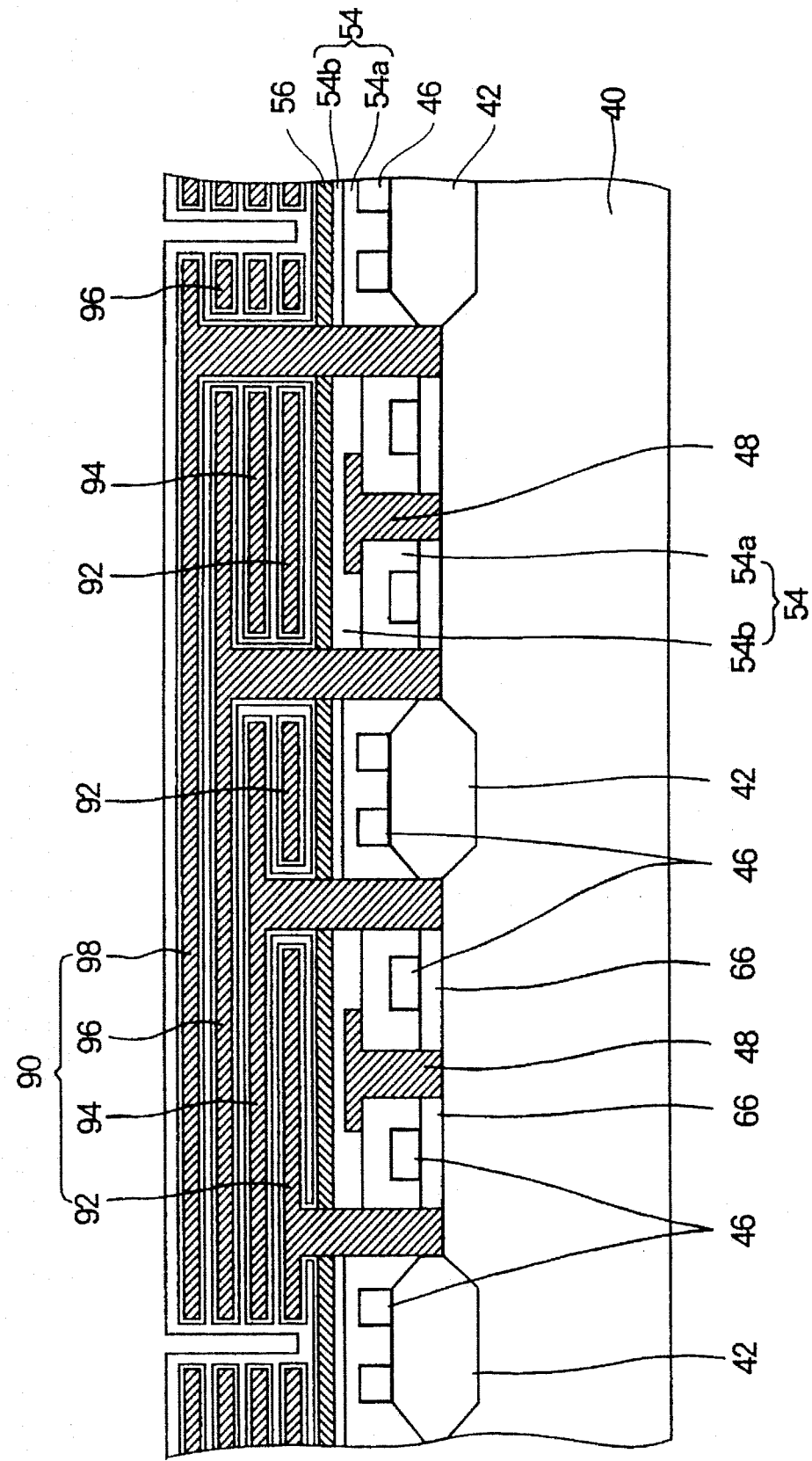
FIG. 6 is a sectional view showing the configuration of the semiconductor memory device of Embodiment 5.

A semiconductor memory device of another embodiment, Embodiment 5, will next be described with reference to FIG. 6. FIG. 6 is a sectional view for explaining the semiconductor memory device of Embodiment 5. In this configuration, the storage electrodes are formed in four layers. This configuration is suitable for a configuration of 1 Gbit DRAM that is required to have a higher degree of integration than a 256 Mbit DRAM.

In this embodiment, the configuration below the etching stopper layer 56 is identical to that of an ordinary 1 Gbit DRAM. The configuration above the etching stopper layer 56 has a four-layer structure in which the storage electrodes of four memory cells arranged in the direction of the data line are superimposed, with their contours being aligned with each other. As a result, the storage electrode 90 can be extended to cover four memory cell regions. The superimposed storage electrodes are electrically insulated from each other. The superimposed storage electrodes are called, in order from the bottom to the top, as first to fourth storage electrodes 92, 94, 96 and 98. The second storage electrode 94 extends through the first storage electrode 92, the third storage electrode 96 extends through the first and second storage electrodes 92 and 94, and the fourth storage electrode 98 extends through the first to third storage electrodes 92, 94 and 96, and they all are connected to the silicon substrate 40.

Figure 7A:
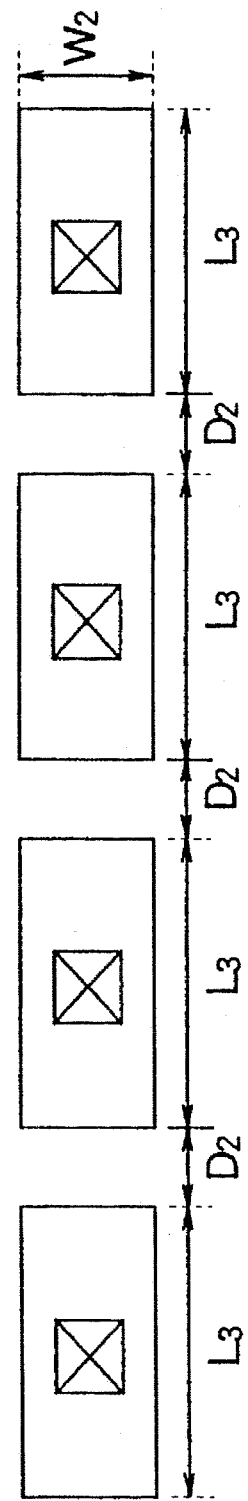
FIG. 7A and FIG. 7B are plan views showing planar patterns and used for comparing and explaining the area of the storage electrode of a 1 Gbit DRAM of Embodiment 5 and the area of the storage electrode of a conventional 1 Gbit DRAM.
Figure 7B:
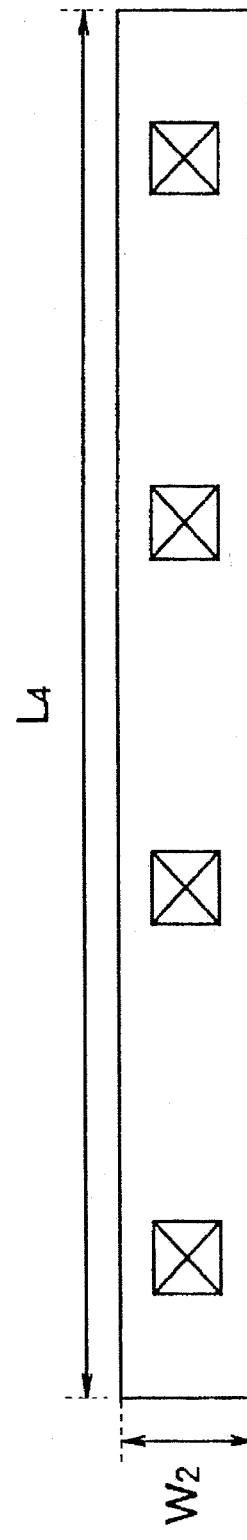
Figure 8A:
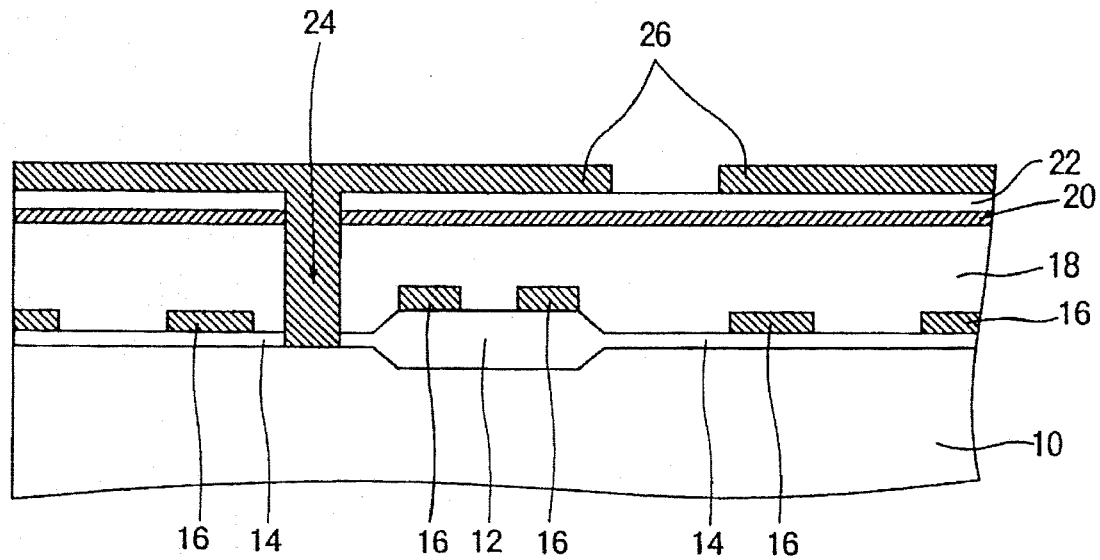
FIG. 8A to FIG. 8E are sectional diagrams showing the semiconductor memory device in the prior art at various steps during fabrication.
Figure 8B:
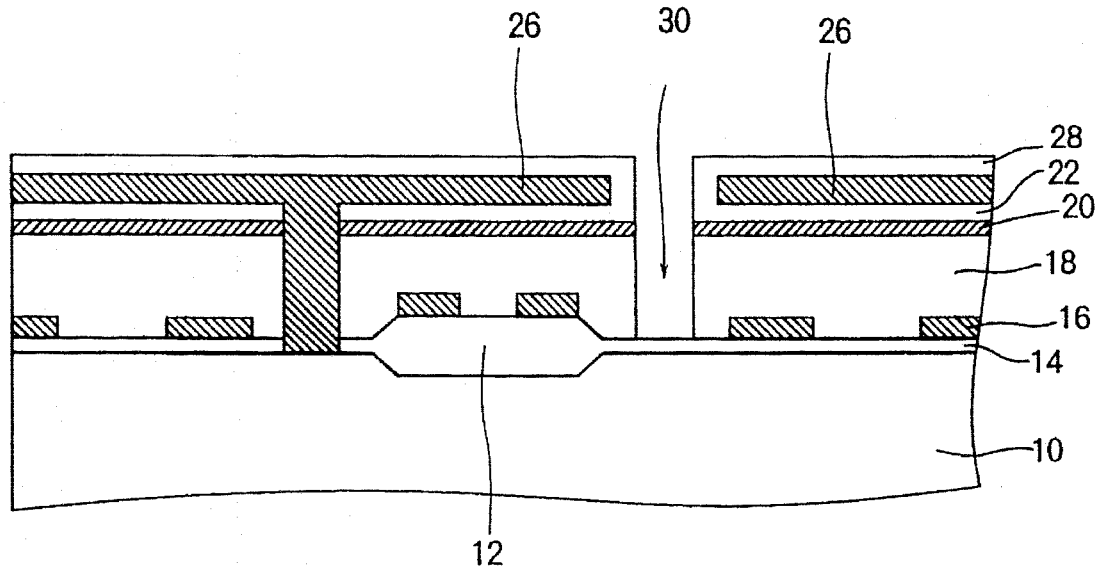
Figure 8C:
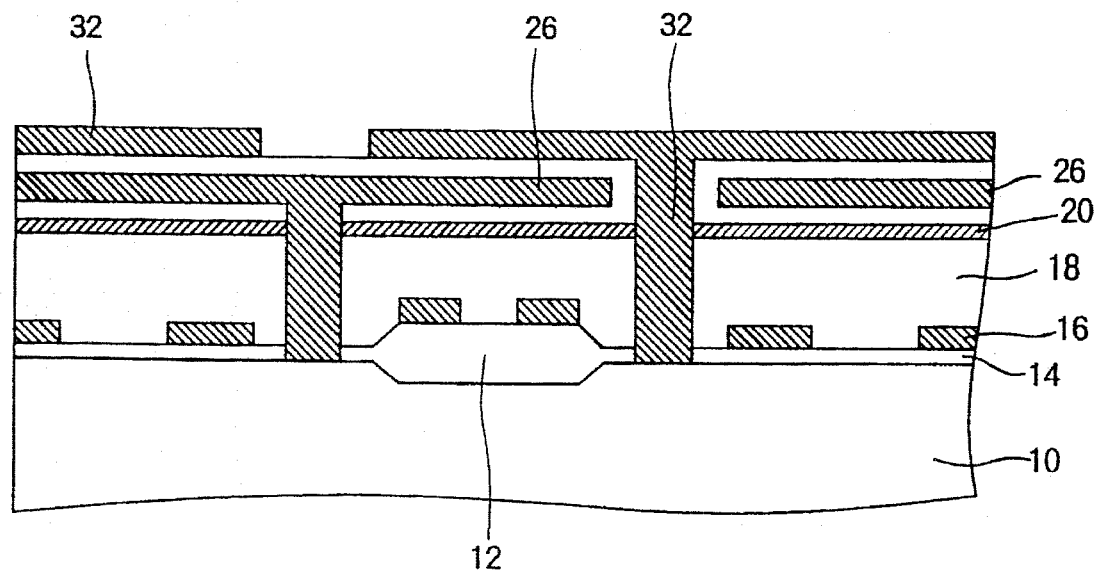
Figure 8D:
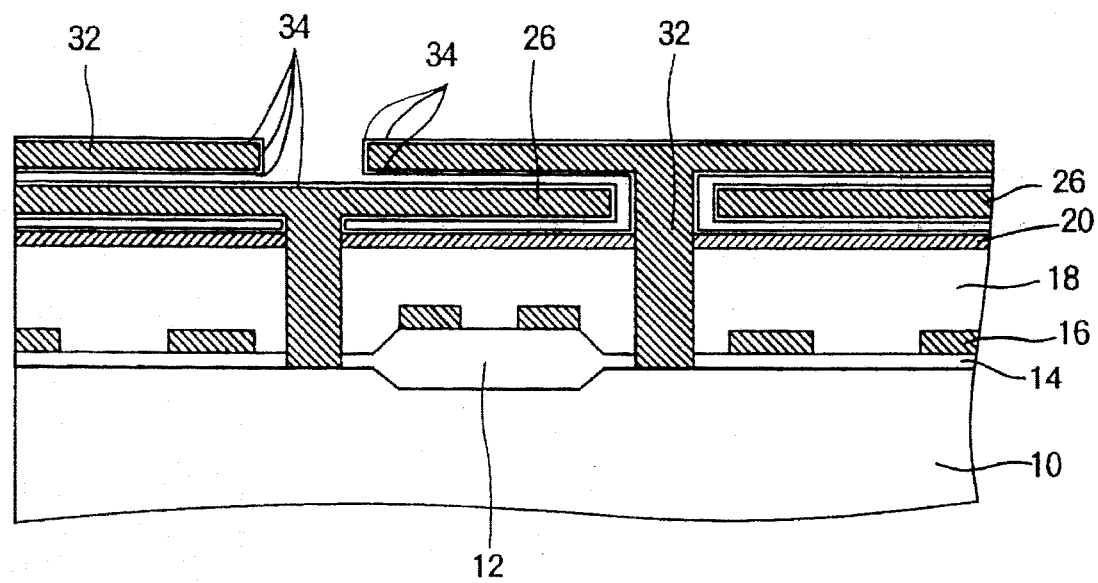
Figure 8E:
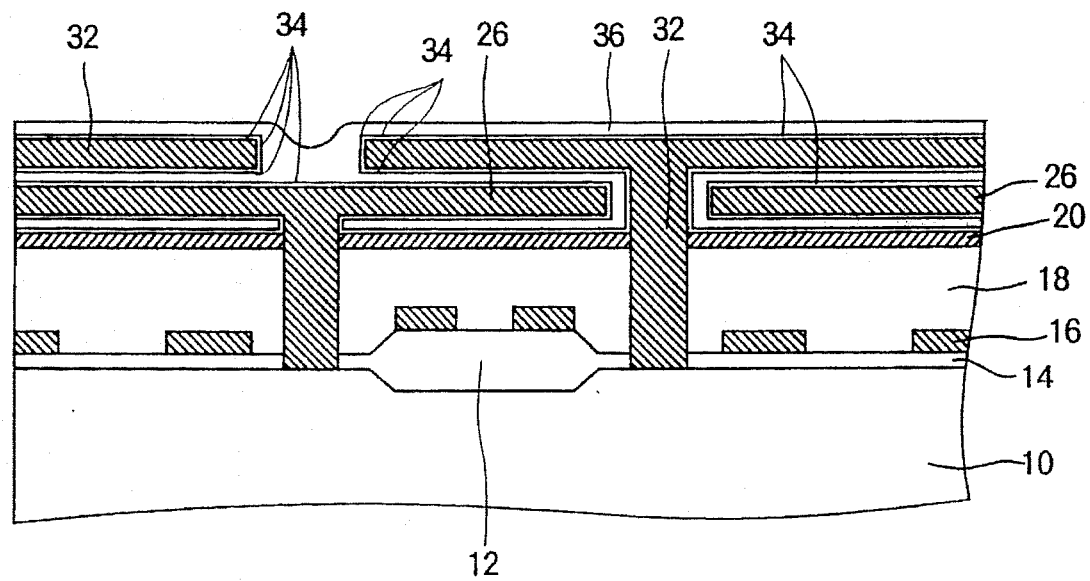
Figure 8F:
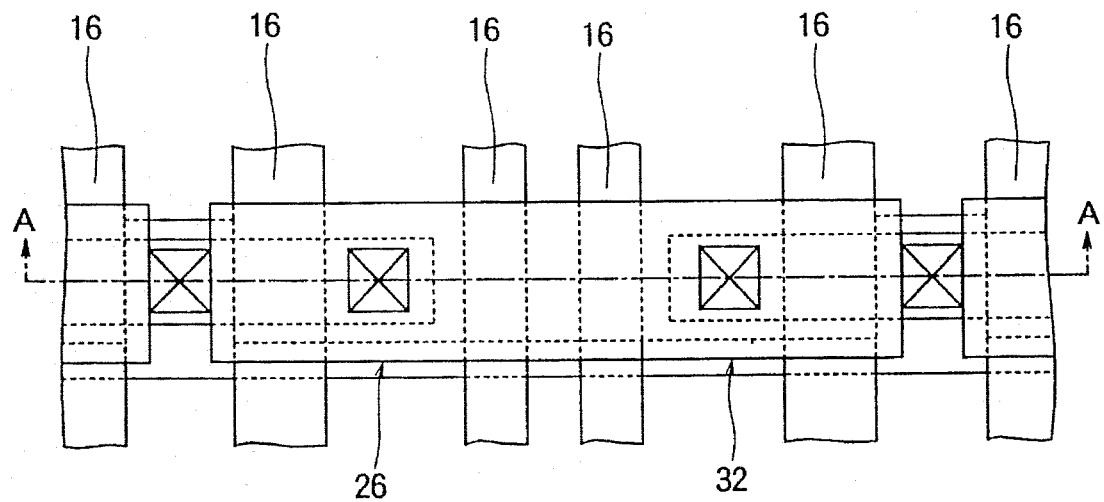
FIG. 8F is a plan view of the device at the step shown in FIG. 8E.

Next, an example of calculation of the area of the storage electrode and the capacitance of the capacitor of the semiconductor memory device of this embodiment will be described. FIG. 7A shows an example of a basic pattern of the memory cells of a 1 Gbit DRAM. FIG. 7B shows a planar pattern of memory cells, similar to those of this embodiment. The area required per memory cell is assumed to be identical between FIG. 7A and FIG. 7B. In the following calculation of the area of the storage electrode, the area of the contact hole of the storage electrode and the area of the part surrounding the storage electrode contact hole and insulating the storage electrodes from each other are omitted.

First, in the case of the 1 Gbit DRAM, if it is estimated that the width W2 of the storage electrode is 0.27 μm, and the length L3 of the storage electrode is 0.69 μm, then the area S0 of one storage electrode of the memory cell of the basic pattern is given by $$S3 = W2 \times L3 = 0.27 \times 0.69 \ \mu m^2$$

Next, as in Embodiment 5, in the case of the planar pattern in which the storage electrodes adjacent to each other are superimposed, if the spacing D2 between the storage electrodes in the basic pattern is 0.15 μm, the length L4 of the storage electrode is estimated to be 3.21 μm, and the area S3 of the storage electrode is given by:

$$S3 = W2 \times L4 = 0.27 \times 3.21 \ \mu m^2$$

The capacitance C3 of the capacitive part of the memory cell is given by:

$$C3 = (\epsilon \epsilon_0 / d2) \times S3 \times 2$$
$$= 20.0 \times 10^{-15} F = 20.0 \ fF$$

This capacitance C3 is sufficient for a capacitor of the memory cell. In the above expression, $\epsilon$ represents the dielectric constant of the capacitor dielectric film and is 3.9, $\epsilon_0$ is the dielectric constant of vacuum and is $8.85 \times 10^{-14}$, and d represents the thickness of the capacitor dielectric film and is $30 \times 10^{-8}$ m. Moreover, since both the upper and lower surfaces of the storage electrodes confront the cell plate, S3 is multiplied by 2.

The semiconductor memory device of Embodiment 5 can be fabricated by a method similar to those of Embodiment 3 or Embodiment 4.

Modifications

In the various embodiments described above, specific materials are used, and specific conditions are used for fabrication. But various changes and modification can be made to such embodiment. For example, instead of extending the storage electrode in one of the data line direction and the word line direction, the storage electrode may be superimposed with those of the memory cells adjacent in any other direction. Instead of superimposing the storage electrodes in two layers or four layers, as in the embodiments described, the storage electrodes may be superimposed in three layers, or five or more layers.

Advantages

According to the configuration of the semiconductor memory device of this invention, storage electrodes of a plurality of memory cells adjacent to each other are provided in superimposition with each other, with their contours being substantially aligned with each other. Moreover, the storage electrodes, except that of the lowermost layer, is connected to the underlying layer (e.g., the semiconductor substrate) by means of a contact hole extending through the storage electrode or electrodes therebelow, and the superimposed storage electrodes are electrically insulated from each other. As a result, each of the storage electrodes can be extended beyond the contact hole for another storage electrode, and the area of the storage electrode is enlarged and the capacitance of the capacitor can be enlarged, without increasing the area occupied per memory cell.

Moreover, with the configuration of the semiconductor memory device of this invention, it is possible to superimpose the storage electrodes in three or more layers to further increase the area of the storage electrode compared with the prior art example.

Furthermore, according the method of fabricating the semiconductor memory device of the invention, after the storage electrode films are formed in superimposition, they are defined, with their contours being aligned, by means of a single photolithography and etching operation. As a result, fabrication is simplified compared with the method in which the storage electrodes are defined one at a time, each time each layer of the storage electrode is formed. Moreover, according to the method of fabricating the semiconductor memory device of this invention, an insulating film (e.g., a thermal oxide film or a sidewall) is formed on the side surface of the contact hole after the formation of the contact hole, so that the superimposed storage electrodes can be electrically insulated from each other.

What is claimed is:

1. A semiconductor memory device including plural memory cells provided on an underlying layer, storage electrodes for each said memory cell, and a cell plate opposed to said storage electrodes with a capacitor dielectric film therebetween, wherein:

said storage electrodes for plural adjacent said memory cells being superimposed relative to each other, said superimposed storage electrodes having contours defined by respective outer edges, said contours of said superimposed storage electrodes being substantially entirely aligned; and said superimposed storage electrodes being insulated from each other and having respective parts that are electrically connected to said underlying layer, said part of each said superimposed storage electrode, other than said part of a lowermost said storage electrode positioned closest to said underlying layer, extending through and being insulated from at least one other said storage electrode that is positioned closer to said underlying layer than is said each storage electrode.

2. A semiconductor memory device as claimed in claim 1, wherein said superimposed storage electrodes extend to cover regions of said plural adjacent memory cells.

3. A semiconductor memory device as claimed in claim 1, wherein said plural adjacent memory cells are aligned in a direction of data lines of said device.

4. A semiconductor memory device as claimed in claim 1, wherein said plural adjacent memory cells are aligned in a direction of word lines of said device.

5. A semiconductor memory device as claimed in claim 1, wherein said contours of said superimposed storage electrodes result from and are defined by a common photolithography treatment.

6. A semiconductor memory device as claimed in claim 1, wherein said part of said each superimposed storage electrode extends through a contact hole formed in said at least one other said storage electrode.

* * * * *